United States Patent
Bechman et al.

(10) Patent No.: US 7,049,863 B2
(45) Date of Patent: May 23, 2006

(54) OUTPUT DRIVER CIRCUIT WITH REDUCED RF NOISE, REDUCED POWER CONSUMPTION, AND REDUCED LOAD CAPACITANCE SUSCEPTIBILITY

(75) Inventors: Gary S. Bechman, Cedar Rapids, IA (US); James P. Young, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 7 days.

(21) Appl. No.: 10/891,276

(22) Filed: Jul. 13, 2004

(65) Prior Publication Data
US 2006/0012407 A1   Jan. 19, 2006

(51) Int. Cl.
*H03B 1/00* (2006.01)
*H03K 3/00* (2006.01)

(52) U.S. Cl. .................... 327/112; 327/108
(58) Field of Classification Search ........ 327/108–112, 327/379
See application file for complete search history.

(56) References Cited

U.S. PATENT DOCUMENTS

| | | | | |
|---|---|---|---|---|
| 5,604,453 A | * | 2/1997 | Pedersen | 327/112 |
| 5,684,410 A | * | 11/1997 | Guo | 326/27 |
| 5,694,065 A | * | 12/1997 | Hamasaki et al. | 327/108 |
| 6,107,889 A | * | 8/2000 | Strange et al. | 331/17 |
| 6,215,349 B1 | * | 4/2001 | Hanson et al. | 327/390 |
| 6,469,562 B1 | * | 10/2002 | Shih et al. | 327/362 |
| 6,678,178 B1 | * | 1/2004 | Lipcsei | 363/98 |

* cited by examiner

*Primary Examiner*—Dinh T. Le
(74) *Attorney, Agent, or Firm*—Farjami & Farjami LLP

(57) ABSTRACT

According to an exemplary embodiment, an output driver circuit includes a pre-conditioning circuit. The output driver circuit further includes a timing control circuit coupled to an output of the pre-conditioning circuit, where the timing control circuit has a first state and a second state. The output driver circuit further includes a first transistor having a first terminal coupled to the timing control circuit and a second transistor having a first terminal coupled to the timing control circuit. When the timing control circuit is in the first state the pre-conditioning circuit output is coupled to the first terminal of the first transistor and not coupled to the first terminal of the second transistor, and when the timing control circuit is in the second state the pre-conditioning circuit output is coupled to the first terminal of the second transistor and not coupled to the first terminal of the second transistor.

18 Claims, 2 Drawing Sheets

OUTPUT DRIVER CIRCUIT WITH REDUCED RF NOISE, REDUCED POWER CONSUMPTION, AND REDUCED LOAD CAPACITANCE SUSCEPTIBILITY

BACKGROUND OF THE INVENTION

1. Field of the Invention

The present invention is generally in the field of semiconductor devices. More specifically, the invention is in the field of output drivers for semiconductor devices.

2. Related Art

Integrated circuit (IC) devices, such as application-specific ICs (ASICs), are typically utilized on system boards for communication devices, such as cellular handsets, as well as other types of electronic devices. These IC devices employ output driver circuits that have output drivers with fast edge rates to generate square wave logic outputs. However, the sharp edges of the square waves generate harmonics that create undesirable radio frequency (RF) noise. The RF noise caused by harmonics generated by the sharp edges of the square waves can interfere with the RF-sensitive components, such as the RF receiver front end of a communication device.

One conventional approach to solving the RF noise problem discussed above includes isolating the output driver circuit from RF-sensitive components. Isolation between the output driver circuit and RF-sensitive components can be achieved by increasing the separation distance between the output drivers and the RF-sensitive components or by enclosing the output driver circuit in a shielded environment. However, both of the above isolation methods undesirably increase the cost of the final product.

Another conventional approach includes reducing the speed of the output drivers in the output driver circuit by utilizing filtering or by reducing the size of the output drivers. However, filtering requires additional system board space and results in increased power consumption, while reducing the size of the output drivers leaves the output drivers more susceptible to load capacitance, which can prevent the output driver circuit from maintaining the required output data rate. Additionally, reducing the size of the output drivers increases the crossover time in which both upper and lower output drive transistors are simultaneously on, which causes an undesirable increase in power consumption by increased "crowbar current."

Thus, there is a need in the art for an output driver circuit in an IC device, such as an ASIC, that generates reduced RF noise, consumes less power, and has reduced susceptibility to output load capacitance.

SUMMARY OF THE INVENTION

The present invention is directed to output driver circuit with reduced RF noise, reduced power consumption, and reduced load capacitance susceptibility. The present invention addresses and resolves the need in the art for an output driver circuit in an IC device, such as an ASIC, that generates reduced RF noise, consumes less power, and has reduced susceptibility to output load capacitance.

According to an exemplary embodiment, an output driver circuit includes a pre-conditioning circuit. The output driver circuit further includes a timing control circuit coupled to an output of the pre-conditioning circuit, where the timing control circuit has a first state and a second state. The pre-conditioning circuit can include an RC network having an input and an output, where the output of the RC network is coupled to the timing control circuit. The pre-conditioning circuit can include at least one inverter, where the at least one inverter is coupled to the input of the RC network, for example. The output driver circuit further includes a first transistor having a first terminal coupled to the timing control circuit. The output driver further includes a second transistor having a first terminal coupled to the timing control circuit. The first transistor can be a PFET and the second transistor can be an NFET, for example.

When the timing control circuit is in the first state the output of the pre-conditioning circuit is coupled to the first terminal of the first transistor and not coupled to the first terminal of the second transistor, and when the timing control circuit is in the second state the output of the pre-conditioning circuit is coupled to the first terminal of the second transistor and not coupled to the first terminal of the second transistor. A second terminal of the first transistor is coupled to a second terminal of the second transistor, where the second terminal of the first transistor and the second terminal of the second transistor are coupled to an output of the output driver circuit. Other features and advantages of the present invention will become more readily apparent to those of ordinary skill in the art after reviewing the following detailed description and accompanying drawings.

DETAILED DESCRIPTION OF THE INVENTION

The present invention is directed to output driver circuit with reduced RF noise, reduced power consumption, and reduced load capacitance susceptibility. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
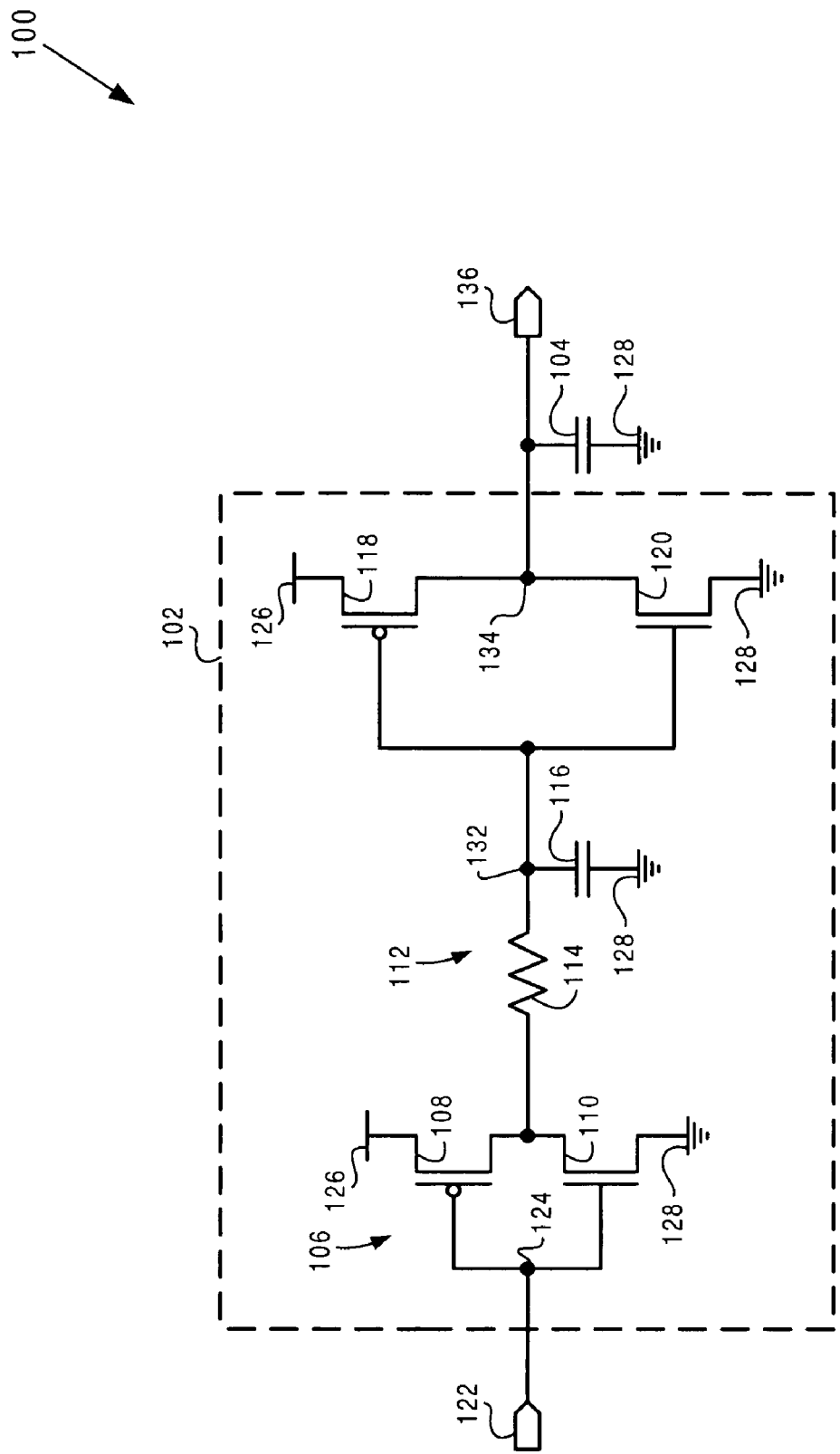
FIG. 1 illustrates a circuit diagram of an exemplary conventional output driver circuit coupled to a capacitive load.

FIG. 1 shows a circuit diagram of an exemplary conventional output driver circuit coupled to a capacitive load. In circuit diagram 100, conventional output driver circuit 102 is coupled to capacitive load 104. Conventional output driver circuit 102 includes inverter 106, which includes transistors 108 and 110, RC network 112, which includes resistor 114 and capacitor 116, and transistors 118 and 120. Conventional output driver circuit 102 can be situated in an IC device, such as an ASIC, which can be part of a system that includes RF and digital components.

As shown in FIG. 1, input 122 of conventional output driver circuit 102 is coupled to the gates of transistors 108 and 110 at node 124 and can receive a digital signal. Transistor 108 can be a P-channel field effect transistor (PFET) and transistor 110 can be an N-channel field effect transistor (NFET). The source of transistor 108 is coupled to supply voltage 126, which may be a supply voltage having a constant DC voltage with no AC component, such as VDD, and the source of transistor 110 is coupled to ground 128. The drains of transistors 108 and 110 are coupled to a first terminal of resistor 114 at node 130. Transistors 108 and 110 form inverter 106, which has an input coupled to input 122 of conventional output driver circuit 102 and an output coupled to the input of RC network 112.

Also shown in FIG. 1, a second terminal of resistor 114 is coupled to a first terminal of capacitor 116 and the gates of transistors 118 and 120 at node 132, and a second terminal of capacitor 116 is coupled to ground 128. Resistor 114 and capacitor 116 form RC network 112, which couples the output of inverter 106 to the gates of transistor 118 and 120. RC network 112 provides a signal having controlled rising and falling edges to the gates of transistors 118 and 120. The rate at which the edges of the signal provided by RC network 112 rise and fall is controlled by the RC time constant, which is determined by the values of resistor 114 and capacitor 116. Transistors 118 and 120 are configured to function as output driver transistors and can be a PFET and an NFET, respectively. Transistor 118 can be configured to output a logic "1," while transistor 120 can be configured to output a logic "0."

Further shown in FIG. 1, the source of transistor 118 is coupled to supply voltage 126 and the source of transistor 120 is coupled to ground 128. The drains of transistors 118 and 120 are coupled to a first end of capacitive load 104 and output 136 of conventional output driver circuit 102 at node 134, and a second end of capacitive load 104 is coupled to ground 128.

The operation of conventional output driver circuit 102 will now be discussed. A digital signal is inputted at input 122 of conventional output driver circuit 102 and coupled to the input of RC network 112 by inverter 106, which ensures that the digital signal is a sharp square wave. RC network 112 provides a slowly rising and falling signal to the gates of transistors 118 and 120, which causes a voltage on the gates of transistors 118 and 120 to slowly ramp up and down. As the voltage on gates of transistors 118 and 120 slowly ramps up, transistor 120 slowly turns on and outputs a logic "0" at output 136 while transistor 118 slowly turns off. Conversely, as the voltage slowly ramps down, transistor 118 slowly turns on and outputs a logic "1" at output 136 while transistor 120 slowly turns off.

However, during a logic "1" to a logic "0" output transition and vice versa, transistors 118 and 120 are both on for a certain length of time, which causes current, i.e. "crowbar current," to be shunted from voltage source 126 to ground 128 through transistors 118 and 120. By way of example, during a logic "1" to a logic "0" or a logic "0" to logic "1" output transition, a current in the order of approximately tens of milliamperes (mA) can be shunted to ground. Thus, the crowbar current produced by conventional driver output circuit 102 wastes power that could otherwise be utilized to drive a logic "1" or a logic "0" at output 136. Additionally, the contention caused by transistors 118 and 120 both being on for a certain length of time causes conventional driver output circuit 102 to be susceptible to capacitive loading, which can undesirably affect the data rates that conventional driver output circuit 102 can support.

Figure 2:
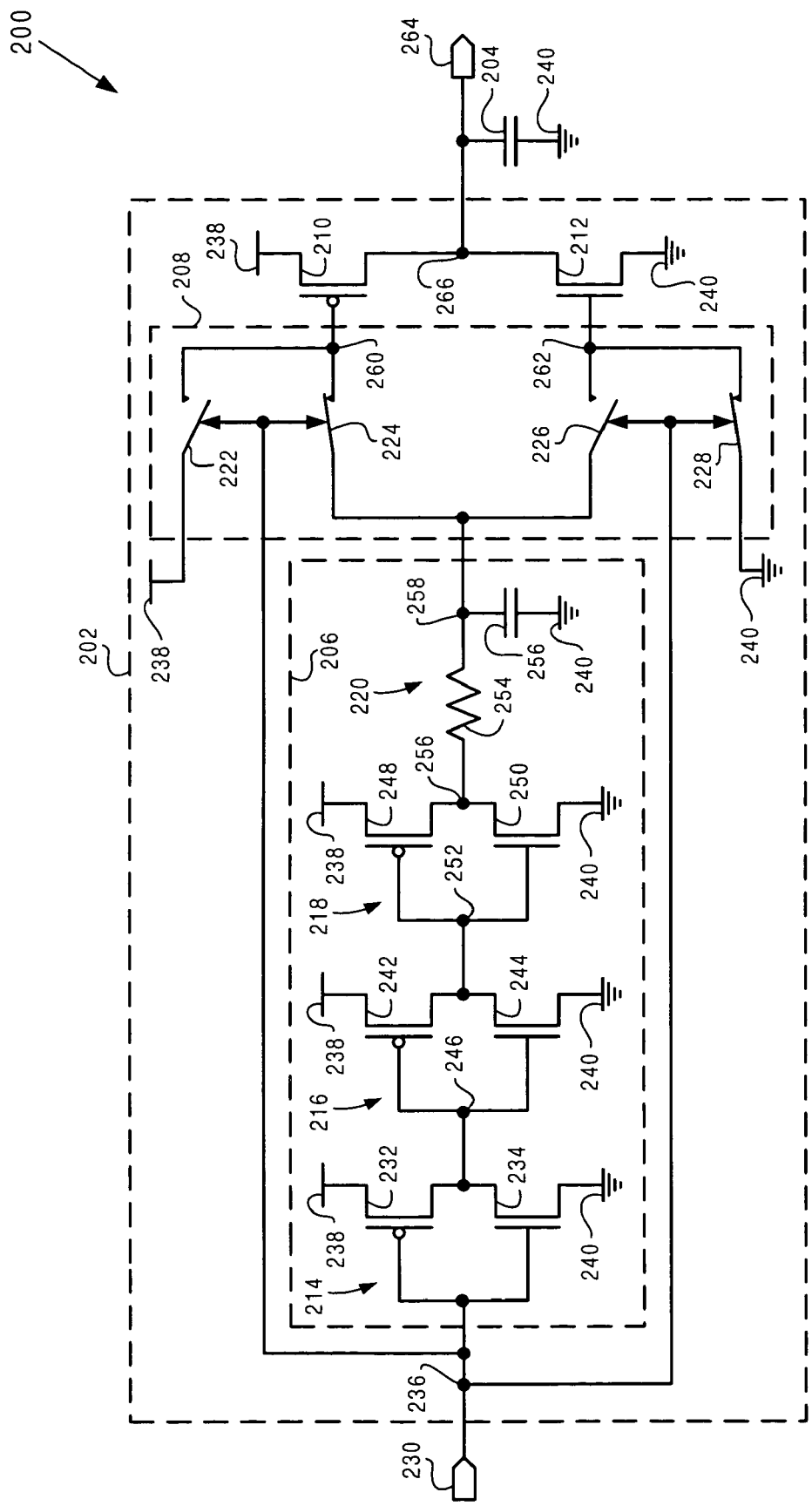
FIG. 2 illustrates a circuit diagram of an exemplary output driver circuit coupled to a capacitive load in accordance with one embodiment of the present invention.

FIG. 2 shows a circuit diagram of an exemplary output driver circuit coupled to a capacitive load in accordance with one embodiment of the present invention. Certain details and features have been left out of FIG. 2, which are apparent to a person of ordinary skill in the art. In circuit diagram 200, output driver circuit 202 is coupled to capacitive load 204 and includes pre-conditioning circuit 206, timing control circuit 208, and transistors 210 and 212. Pre-conditioning circuit 206 includes inverters 214, 216, and 218, and RC network 220 and timing control circuit 208 includes switches 222, 224, 226, and 228. Output driver circuit 202 can be situated in an IC device, such as an ASIC, which can be part of a system that includes RF and digital components. It is noted that while NFETs and PFETs have been used as specific examples for the various transistors in pre-conditioning circuit 206 and for transistors 210 and 212, one or more of such transistors can be bipolar transistors and/or other types of transistors.

As shown in FIG. 2, input 230 of output driver circuit 202 is coupled to the input of pre-conditioning circuit 206, the gates of transistors 232 and 234, and first terminals of switches 222, 224, 226, and 228 at node 236. Input 230 of output driver circuit 202 can be configured to receive a digital signal. Also shown in FIG. 2, the source of transistor 232 is coupled to supply voltage 238, which may be a supply voltage having a constant DC voltage with no AC component, such as VDD, and the source of transistor 234 is coupled to ground 240. The drains of transistors 232 and 234 are coupled to the gates of transistors 242 and 244 at node 246. Transistors 232 and 234 form inverter 214 and can comprise a PFET and an NFET, respectively.

Further shown in FIG. 2, the source of transistor 242 is coupled to supply voltage 238, the source of transistor 244 is coupled to ground 240, and the drains of transistors 242 and 244 are coupled to the gates of transistors 248 and 250 at node 252. Transistors 242 and 244 form inverter 216 and can comprise a PFET and an NFET, respectively. Also shown in FIG. 2, the source of transistor 248 is coupled to supply voltage 238, the source of transistor 250 is coupled to ground 240, and the drains of transistors 248 and 250 are coupled to a first terminal of resistor 254 at node 256. Transistors 248 and 250 form inverter 218 and can comprise a PFET and an NFET, respectively.

Inverters 214, 216, and 218 are coupled in series and can be configured to receive a digital signal at input of inverter 214 at node 236 and output a digital signal with sharpened the edges at the output of inverter 218. Thus, inverters 214, 216, and 218 ensure that a digital signal having sharp edges, i.e. a digital signal having a sharp square wave shape, is provided at the input of RC network 220 at node 256. In one embodiment, inverters 214, 216, and 218 are not used. In other embodiments, pre-conditioning circuit 206 can comprise one or more inverters, such as inverters 214, 216, and 218.

Further shown in FIG. 2, a second terminal of resistor 254 is coupled to a first terminal of capacitor 256 and the second terminals of switches 224 and 226 at node 258, and the second terminal of capacitor 256 is coupled to ground 240. Resistor 254 and capacitor 256 form RC network 220, which is coupled to the output of inverter 218 at node 256 and coupled to the input of timing control circuit 208 at node 258, which corresponds to the output of pre-conditioning circuit 206. RC network 220 can be configured to provide a signal having controlled rising and falling edges to the input of timing control circuit 208. The rate at which the edges of the signal provided by RC network 220 rise and fall is controlled by the RC time constant that is determined by the values of resistor 254 and capacitor 256. Thus, RC network 220 can output a signal that gradually rises and falls and has no sharp edges. The values of resistor 254 and capacitor 256 can be determined to enable output driver circuit 202 to support a required data rate.

Also shown in FIG. 2, the second terminal of switch 222 is coupled to supply voltage 238 and the third terminal of switch 222 is coupled to the third terminal of switch 224 and the gate of transistor 210 at node 260. Switches 222 and 224 can comprise a complimentary metal-oxide semiconductor (CMOS) pass gate or other appropriate switching device. Switches 222 and 224 are controlled by a digital signal coupled to respective first terminals, i.e. the control terminals, of switches 222 and 224 at node 236. Further shown in FIG. 2, the second terminal of switch 228 is coupled to ground 240 and the third terminal of switch 228 is coupled to the third terminal of switch 226 and the gate of transistor 212 at node 262. Switches 226 and 228 can comprise a CMOS pass gate or other appropriate switching device. Switches 226 and 228 are controlled by a digital signal coupled to respective first terminals, i.e. the control terminals, of switches 226 and 228 at node 236. In other embodiments, switches 222, 224, 226, and 228 may be controlled by a different signal or in a different manner.

Also shown in FIG. 2, the source of transistor 210 is coupled to voltage source 238 and the source of transistor 212 is coupled to ground 240. Further shown in FIG. 2, the drains of transistors 210 and 212 are coupled to a first terminal of capacitive load 204 and output 264 of output driver circuit 202 at node 266, and a second terminal of capacitive load 204 is coupled to ground 240. Transistors 210 and 212 are configured to function as output driver transistors and can comprise a PFET and an NFET, respectively. Transistors 210 can be configured to output a logic "1" at output 264 and transistor 212 can be configured to output a logic "0" at output 264 when appropriate voltages are applied to the respective gates of transistors 210 and 212.

Timing control circuit 208 comprises switches 222, 224, 226, and 228 and can be configured to operate in a first state, which corresponds to a logic "0" to logic "1" transition of a signal that controls switches 222, 224, 226, and 228, i.e. a digital signal inputted at input 230 of output driver circuit 202, and in a second state, which corresponds to a logic "1" to logic "0" transition of the digital signal inputted at input 230. In the first state, switches 224 and 228 are closed and switches 222 and 226 are open, and in the second state, switches 222 and 226 are closed and switches 224 and 228 are open.

The operation of the invention's output driver circuit 202 will now be discussed. A digital signal is inputted at input 230 of output driver circuit 202 and coupled to the input of RC network 220 by inverters 214, 216, and 218, which sharpen the edges of the digital signal, and drive RC network 220. The RC network 220 controls the slope of the rising and falling edges of the signal and provides a signal having slowly rising and falling edges at node 258, i.e. the output of pre-conditioning circuit 206. In the first state, which occurs when the digital signal inputted at input 230 transitions from logic "0" to logic "1," switches 224 and 228 close and switches 222 and 226 open. As a result, timing control circuit 208 couples a slowly falling signal at node 258 to the gate of transistor 210, which causes a voltage on the gate of transistor 210 to slowly ramp down and slowly turn on transistor 210. As a result, transistor 210 output a logic "1" at output 264 of output driver circuit 202. Also, in the first state, timing control circuit 208 couples the gate of transistor 212 to ground, which clamps off transistor 212.

In the second state, which occurs when the digital signal inputted at input 230 of output driver circuit 202 transitions from logic "1" to logic "0," switches 222 and 226 close and switches 224 and 228 open. As a result, timing control circuit 208 couples a slowly rising signal at node 258 to the gate of transistor 212, which causes a voltage on the gate of transistor 212 to slowly ramp up and slowly turn on transistor 212. As a result, transistor 212 outputs a logic "0" at output 264 of output driver circuit 202. Also, in the second state, timing control circuit 208 couples the gate of transistor 210 to supply voltage 238, which clamps off transistor 210. Thus, timing control circuit 208 ensures that when transistor 210 is on, transistor 212 is clamped off, and when transistor 212 is on, transistor 210 is clamped off. As a result, a substantial reduction in undesirable crowbar current, which is caused when both output driver transistors are on at the same time, is achieved.

As a result of utilizing RC network 220 in pre-conditioning circuit 206 to appropriately control the timing and slope of the signal inputted at the gate of transistor 210 in the first state, i.e. when the digital signal inputted at input 230 transitions from logic "0" to logic "1," transistor 210 outputs a signal, i.e. a logic "1," having appropriately sloped edges. Similarly, in the second state, i.e. when the digital signal inputted at input 230 transitions from logic "1" to logic "0," transistor 212 outputs a signal, i.e. a logic "0," having appropriately sloped edges. As a result, the present invention advantageously achieves an output driver circuit that generates a digital output signal at output 264 having substantial reduction in undesirable harmonics, which generate undesirable RF noise, compared to a conventional output driver circuit, such as conventional output driver circuit 102 in FIG. 1. For example, the present invention can advantageously achieve a 50.0 percent or greater reduction in undesirable output driver harmonics compared to conventional output driver circuit 102.

Additionally, RC network 220 enables the present invention to advantageously meet required data rates by appropriately controlling the RC time constant. Moreover, the substantial reduction in undesirable harmonics and, consequently, a substantial reduction in RF noise caused by the undesirable harmonics is achieved by internally controlling the shape of the signal that drives the output driver transistors. As a result, the present invention advantageously saves the additional cost and system board space required to provide external filtering components to reduce undesirable harmonics generated by the digital output signal in a conventional output driver circuit.

Also, by utilizing a timing control circuit to prevent the output driver transistors, i.e. transistors 210 and 212, from being on at the same time, the present invention advantageously achieves a substantial reduction in crowbar current compared to a conventional output driver circuit. For example, the present invention advantageously achieves an approximate 85.0 percent reduction in crowbar current compared to conventional output driver circuit 102 in FIG. 1. As a result, the present invention advantageously achieves a substantial reduction in power consumption compared to conventional output driver circuit 102, which is particularly advantageous in low-power applications.

Furthermore, by substantially reducing undesirable crowbar current and internally controlling the slope of the digital output signal, the effect of the capacitive load, such as capacitive load 204, on the output signal in the present invention is substantially reduced. For example, an increase in capacitive load from 1.5 picofarads (pF) to 15.0 pF causes a minimal effect on the edge slope of the digital signal outputted in the present invention. In contrast, in conventional output driver circuit 102 in FIG. 1, an increase in capacitive load from 1.5 pF to 15.0 pF causes a substantial effect on the edge slope of the digital output signal. Thus, the present invention advantageously achieves decreased susceptibility to capacitive output loading compared to conventional output driver circuit 102.

It is appreciated by the above detailed description that the invention provides a multi-mode bias circuit for power amplifiers that is effective, easy to implement, and cost-effective. From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. For example, while NFETs and PFETs have been used as specific examples for the various transistors in pre-conditioning circuit 206 and for transistors 210 and 212, one or more of such transistors can be bipolar transistors and/or other types of transistors. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

Thus, output driver circuit with reduced RF noise, reduced power consumption, and reduced load capacitance susceptibility has been described.

The invention claimed is:

1. An output driver circuit having an input and an output, said output driver circuit comprising:
   a pre-conditioning circuit coupled to said input of said output driver circuit, said pre-conditioning circuit comprising an RC network having an RC network input and an RC network output;
   a timing control circuit coupled to said RC network output, said timing control circuit having a first state and a second state;
   a first transistor having a first terminal coupled to said timing control circuit;
   a second transistor having a first terminal coupled to said timing control circuit;
   wherein when said timing control circuit is in said first state said RC network output is coupled to said first terminal of said first transistor and not coupled to said first terminal of said second transistor, and wherein when said timing control circuit is in said second state said RC network output is coupled to said first terminal of said second transistor and not coupled to said first terminal of said second transistor.

2. The output driver circuit of claim 1 wherein a second terminal of said first transistor is coupled to a second terminal of said second transistor, wherein second terminal of said first transistor and said second terminal of said second transistor are coupled to said output of said output driver circuit.

3. The output driver circuit of claim 1 wherein said first terminal of said first transistor is coupled to a first terminal of a first switch in said timing control circuit, wherein said second terminal of said first switch is coupled to VDD, wherein said first switch is open in said first state and closed in said second state.

4. The output driver circuit of claim 3 wherein said first terminal of said first transistor is coupled to said RC network output by a second switch in said timing control circuit, wherein said second switch is closed in said first state and open in said second state.

5. The output driver circuit of claim 1 wherein said first terminal of said second transistor is coupled to a first terminal of a first switch in said timing control circuit, wherein said second terminal of said first switch is coupled to ground, wherein said first switch is closed in said first state and open in said second state.

6. The output driver circuit of claim 5 wherein said first terminal of said second transistor is coupled to said RC network output by a second switch in said timing control circuit, wherein said second switch is open in said first state and closed in said second state.

7. The output driver circuit of claim 1 wherein said pre-conditioning circuit comprises at least one inverter, said at least one inverter being coupled to said input of said RC network.

8. The output driver circuit of claim 1 wherein said first transistor is a PFET.

9. The output driver circuit of claim 1 wherein said second transistor is an NFET.

10. An output driver circuit having an input and an output, said output driver circuit comprising:
    a pre-conditioning circuit coupled to said input of said output driver circuit, said pre-conditioning circuit comprising an RC network having an RC network input and an RC network output;
    a timing control circuit connected to said RC network output, said timing control circuit having a first state and a second state;
    a first FET having a gate connected to said timing control circuit;
    a second FET having a gate connected to said timing control circuit;
    wherein when said timing control circuit is in said first state said RC network output is coupled to said gate of said first FET and not coupled to said gate of said second FET, and wherein when said timing control circuit is in said second state said RC network output is coupled to said gate of said second FET and not coupled to said gate of said first FET.

11. The output driver circuit of claim 10 wherein a drain of said first FET is coupled to a drain of said second FET, wherein second drain of said first FET and said drain of said second FET are coupled to said output of said output driver circuit.

12. The output driver circuit of claim 10 wherein said gate of said first FET is coupled to a first terminal of a first switch in said timing control circuit, wherein said second terminal of said first switch is coupled to VDD, wherein said first switch is open in said first state and closed in said second state.

13. The output driver circuit of claim 12 wherein said gate of said first FET is coupled to said RC network output by a second switch in said timing control circuit, wherein said second switch is closed in said first state and open in said second state.

14. The output driver circuit of claim 10 wherein said gate of said second FET is coupled to a first terminal of a first switch in said timing control circuit, wherein said second terminal of said first switch is coupled to ground, wherein said first switch is closed in said first state and open in said second state.

15. The output driver circuit of claim 14 wherein said gate of said second FET is coupled to said RC network output by a second switch in said timing control circuit, wherein said second switch is open in said first state and closed in said second state.

16. The output driver circuit of claim 10 wherein said pre-conditioning circuit comprises at least one inverter, said at least one inverter being coupled to said RC network input.

17. The output driver circuit of claim 10 wherein said first FET outputs a logic "1" in said first state.

18. The output driver circuit of claim 10 wherein said second FET outputs a logic "0" in said second state.

* * * * *